(12) United States Patent
Liu et al.

(10) Patent No.: US 12,119,529 B2
(45) Date of Patent: Oct. 15, 2024

(54) PHASE SHIFTER, MANUFACTURING METHOD THEREOF AND ANTENNA

(71) Applicants: Beijing BOE Technology Development Co., Ltd., Beijing (CN); BOE TECHNOLOGY GROUP CO., LTD., Beijing (CN)

(72) Inventors: Zongmin Liu, Beijing (CN); Chunxin Li, Beijing (CN); Wei Li, Beijing (CN); Xichao Fan, Beijing (CN); Junwei Guo, Beijing (CN); Jijing Huang, Beijing (CN); Mengjun Hou, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 594 days.

(21) Appl. No.: 17/442,197

(22) PCT Filed: Jan. 29, 2021

(86) PCT No.: PCT/CN2021/074425
§ 371 (c)(1),
(2) Date: Sep. 23, 2021

(87) PCT Pub. No.: WO2022/160250
PCT Pub. Date: Aug. 4, 2022

(65) Prior Publication Data
US 2023/0097839 A1  Mar. 30, 2023

(51) Int. Cl.
*H01P 1/18* (2006.01)
*H01P 3/08* (2006.01)
*H01P 11/00* (2006.01)
*H01Q 3/36* (2006.01)

(52) U.S. Cl.
CPC ............. *H01P 1/184* (2013.01); *H01P 3/08* (2013.01); *H01P 11/003* (2013.01); *H01Q 3/36* (2013.01)

(58) Field of Classification Search
CPC .. H01P 1/184; H01P 1/18; H01P 1/181; H01P 1/182; H01P 11/003; H01P 1/10; H01P 1/127; H01P 1/185; H01P 11/00; H01Q 3/36; H01Q 1/48; H01Q 3/34; B81B 7/02; B81B 2203/04; B81B 2203/0109; B81B 2207/015
See application file for complete search history.

(56) References Cited

U.S. PATENT DOCUMENTS

2020/0257149 A1* 8/2020 Li .................. G02F 1/134309

* cited by examiner

*Primary Examiner* — Lincoln D Donovan
*Assistant Examiner* — Tyler J Pereny
(74) *Attorney, Agent, or Firm* — HOUTTEMAN LAW LLC

(57) ABSTRACT

The disclosure provides a phase shifter, a manufacturing method thereof and an antenna, and belongs to the field of communication technology. The phase shifter includes a first substrate; a signal line and reference lines on the first substrate; a first insulating layer on the signal line; a plurality of electrode film bridges on a side of the first insulating layer distal to the signal line; and a first transmission structure on the first insulating layer and electrically connected to the signal line; and an orthographic projection of the first transmission structure on the first substrate is not overlapped with an orthographic projection of the plurality of electrode film bridges on the first substrate.

20 Claims, 7 Drawing Sheets

PHASE SHIFTER, MANUFACTURING METHOD THEREOF AND ANTENNA

TECHNICAL FIELD

The disclosure belongs to the field of communication technology, and particularly relates to a phase shifter and a manufacturing method thereof, and an antenna.

BACKGROUND

With a rapid development of the information age, a wireless terminal with high integration, miniaturization, multifunction, and low cost has gradually become a trend of communication technology. A phase shifter is an essential key component in communication and radar applications. A conventional phase shifter mainly includes a ferrite phase shifter or a semiconductor phase shifter. The ferrite phase shifter has a large power capacity and a small insertion loss, but the disadvantages of complex process, expensive manufacturing cost, large volume and the like limit the large-scale application of the ferrite phase shifter; the semiconductor phase shifter has a small volume, a high operating speed, but has disadvantages of small power capacity, high power consumption and high difficulty in manufacturing.

Compared with the conventional phase shifter, a microelectro-mechanical system (MEMS) phase shifter in the prior art has obvious advantages in insertion loss, power consumption, volume, cost and the like, and has attracted wide attention in the fields of radio communication, microwave technology and the like. The MEMS phase shifter generally has a first substrate, a signal line and a reference line disposed on the first substrate, and a plurality of electrode film bridges disposed on a side of the signal line distal to the first substrate; the electrode film bridges are disposed on the signal line in a suspended manner; and a distributed capacitor is formed between the signal line and the electrode film bridges to shift a phase of a radio frequency signal. In order to form a variable capacitor, a direct current bias voltage needs to be applied to the signal line through a transmission line, and the signal line is also used for transmitting the radio frequency signal, so that the radio frequency signal leaks to the transmission line for the direct current bias voltage, which causes the problems of increased insertion loss and reduced stability of the phase shifter.

SUMMARY

The disclosure aims to solve at least one of technical problems in the prior art, and provides a phase shifter which may avoid a radio frequency signal from leaking to a transmission structure of a direct current bias voltage, so that the low insertion loss performance of the phase shifter may be ensured, and the stability of the phase shifter is improved.

In a first aspect, a solution to solve the technical problem of the present disclosure is a phase shifter, including:

a first substrate;

a signal line and reference lines on at least one side of an extending direction of the signal line, wherein the signal line and the reference lines are both on the first substrate;

a first insulating layer on a side of the signal line distal to the first substrate;

a plurality of electrode film bridges on a side of the first insulating layer distal to the signal line; each electrode film bridge includes a main portion and at least one connection portion; an orthographic projection of the main portion on the first substrate at least partially overlaps with an orthographic projection of the signal line on the first substrate, and the main portion and the first insulating layer have a gap therebetween; the at least one connection portion is connected to the main portion, and an orthographic projection of the connection portion on the first substrate at least partially overlaps with the orthographic projection of the reference lines on the first substrate; and a first transmission structure on a side of the first insulating layer distal to the first substrate and electrically connected to the signal line; and an orthographic projection of the first transmission structure on the first substrate is not overlapped with an orthographic projection of the plurality of electrode film bridges on the first substrate.

In the phase shifter provided by the disclosure, the first transmission structure is provided to apply the direct current bias voltage to the signal line and may avoid leakage of the radio frequency signal on the signal line to the first transmission structure, so that the low insertion loss performance of the phase shifter may be ensured, and the stability of the phase shifter is improved.

In some embodiments, the first transmission structure is a high-resistance transmission line having a sheet resistance greater than that of the signal line, and a first end of the high-resistance transmission line is connected to the signal line and a second end of the high-resistance transmission line is connected to a direct current bias voltage source.

In some embodiments, a material of the high-resistance transmission line at least includes indium tin oxide.

In some embodiments, the first transmission structure is a high-frequency transmission line including a plurality of first connection segments and a plurality of second connection segments which are connected end to end; the plurality of first connection segments are separated from each other along the same direction; each second connection segment is connected between two adjacent first connection segments; and the plurality of first connection segments extend along a first direction, the plurality of second connection segments extend along a second direction, and the first direction intersects with the second direction.

In some embodiments, one of the first direction and the second direction is perpendicular to the extending direction of the signal line, and the other is parallel to the extending direction of the signal line.

In some embodiments, a length of one of the first connection segments is different from a length of one of the second connection segments.

In some embodiments, the first transmission structure includes a first transmission line, which is in a planar spiral shape, to form a planar inductor; and a first end of the first transmission line is connected to the signal line, and a second end of the first transmission line is connected to a direct current bias voltage source.

In some embodiments, the first insulating layer has a through hole therein;

the first transmission line includes a first sub-transmission line and a second sub-transmission line; the first sub-transmission line is on a side of the first insulating layer distal to the first substrate, and the second sub-transmission line is on a side of the first insulating layer proximal to the first substrate; and the first sub-transmission line is in the planar spiral shape to form the planar inductor, a first end of the first sub-transmission line is connected to the signal line, and a second end of the first sub-transmission line is connected to a first end of the second sub-transmission line through the through hole; and a second end of the second sub-transmission line is connected to the direct current bias voltage source.

In some embodiments, the first transmission line is in a rectangular planar spiral shape.

In some embodiments, the first insulating layer has a hollow portion, and an orthogonal projection of the first end of the signal line on the first substrate is within an orthogonal projection of the hollow portion on the first substrate; and an auxiliary electrode is on a side of the first end of the signal line distal to the first substrate, and the first end of the first transmission structure is connected to the first end of the signal line through the auxiliary electrode.

In some embodiments, the orthographic projection of the first transmission structure on the first substrate at least partially overlaps the orthographic projection of the reference lines on the first substrate.

In some embodiments, an edge of the connection portion proximal to the signal line is aligned with an edge of the reference line corresponding to the connection portion proximal to the signal line.

In some embodiments, the main portion includes two first portions and a second portion connected therebetween, and the connection portion is connected to at least one of the two first portions;

an orthographic projection of the first portion on the first substrate is not overlapped with the orthographic projection of the signal line on the first substrate; an orthographic projection of the second portion on the first substrate at least partially overlaps with the orthographic projection of the signal line on the first substrate; and along the extending direction of the signal line, a width of the connection portion is not less than a width of the first portion; the width of the first portion is not less than a width of the second portion.

In some embodiments, the main portion has a plurality of openings therein.

In a second aspect, the present disclosure further provides a method for manufacturing a phase shifter, including steps of:

forming a signal line and reference lines on a first substrate, the reference lines being located on at least one side of an extending direction of the signal line forming a first insulating layer on a side of the signal line distal to the first substrate;

forming a first transmission structure on a side of the first insulating layer distal to the first substrate, wherein the first transmission structure is electrically connected to the signal line; an orthographic projection of the first transmission structure on the first substrate is not overlapped with an orthographic projection of a plurality of electrode film bridges on the first substrate; and forming a plurality of electrode film bridges on a side of the first insulating layer distal to the signal line; wherein each electrode film bridge includes a main portion and at least one connection portion; an orthographic projection of the main portion on the first substrate at least partially overlaps with the orthographic projection of the signal line on the first substrate, and a gap is formed between the main portion and the first insulating layer; the at least one connection portion is connected to the main portion, and an orthographic projection of the connection portion on the first substrate at least partially overlaps with the orthographic projection of the reference lines on the first substrate.

In a third aspect, the present disclosure further provides an antenna, which includes a plurality of above phase shifters.

DETAIL DESCRIPTION OF EMBODIMENTS

Figure 1:
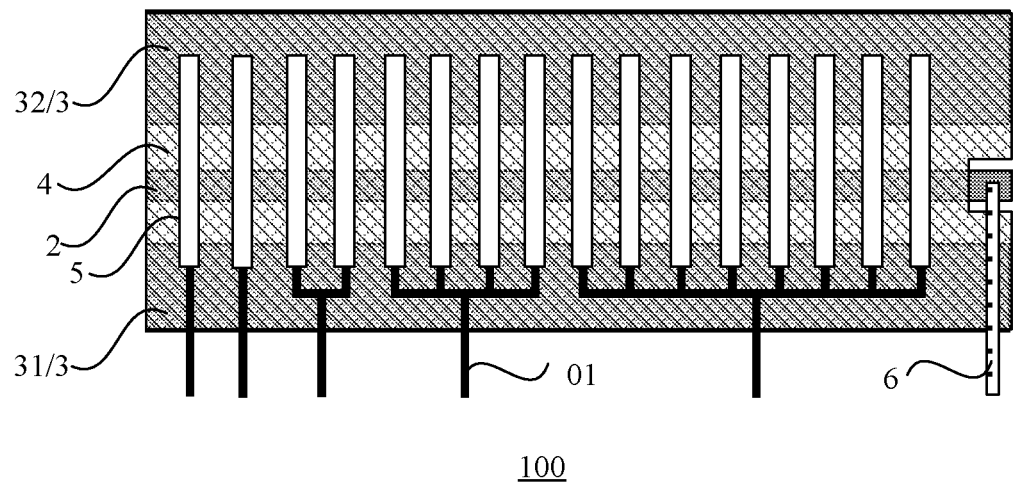
FIG. 1 is a schematic structural diagram of a phase shifter according to an embodiment of the present disclosure.

To enable one of ordinary skill in the art to better understand technical solutions of the present disclosure, the present disclosure will be further described in detail below with reference to the accompanying drawings and exemplary embodiments.

Unless defined otherwise, technical or scientific terms used herein should have the same meaning as commonly understood by one of ordinary skill in the art to which the present disclosure belongs. The terms of "first", "second", and the like herein are not intended to indicate any order, quantity, or importance, but rather are used for distinguishing one element from another. Further, the term of "a", "an", "the", or the like used herein does not denote a limitation of quantity, but rather denotes the presence of at least one element. The term of "comprising", "including", or the like, means that the element or item preceding the term contains the element or item listed after the term and the equivalent thereof, but does not exclude the presence of other elements or items. The term "connected", "coupled", or the like is not limited to a physical or mechanical connection, but may include an electrical connection, whether direct or indirect connections. The terms "upper", "lower", "left", "right", and the like are used only for indicating relative positional relationships, and when the absolute position of an object being described is changed, the relative positional relationships may also be changed accordingly.

It is noted that in the present disclosure, two structures are "in a same layer", which means that they are formed by a same material layer, and thus, they are in a same layer in a stack, but does not mean that they are equally spaced from a substrate (a distance between one of the two structures and the substrate is equal to that between the other structure and the substrate), nor that other layers respectively between the two structures and the substrate have a completely same structure.

The disclosure will be described in more detail below with reference to the drawings. Like elements are denoted by like reference numerals throughout the drawings. For purposes of clarity, elements in the drawings are not drawn to scale. Moreover, certain well known elements may not be shown in the drawings.

Figure 2:
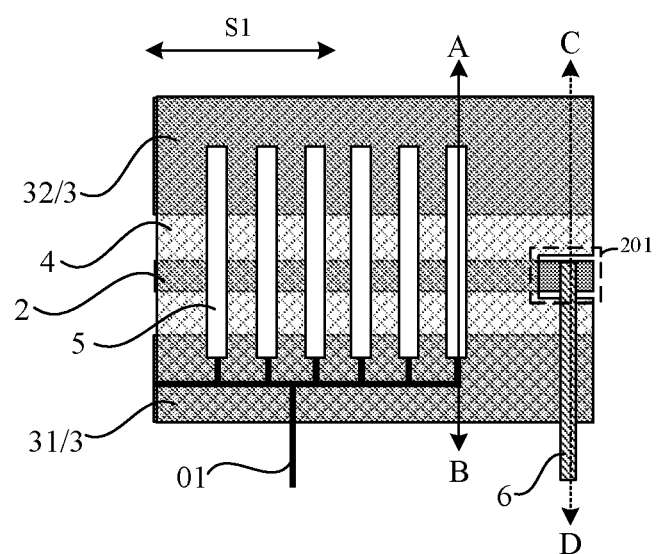
FIG. 2 is a schematic structural diagram of a part of a phase shifter according to an embodiment of the disclosure.
Figure 3:
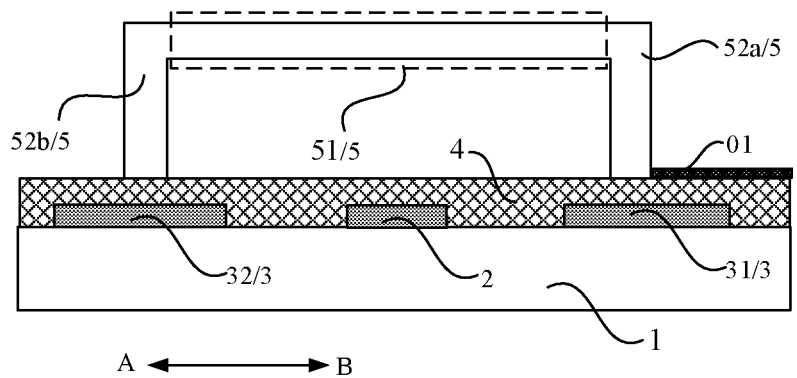
FIG. 3 is a cross-sectional view taken along a line A-B of FIG. 2.

In a first aspect, referring to FIG. 1 to FIG. 3, in order to more clearly illustrate a structure, FIG. 2 is a partial schematic structural diagram of FIG. 1. An embodiment of the present disclosure provides a phase shifter, taking a phase shifter 100 as an example, which includes a first substrate 1, a signal line 2, reference lines 3, a first insulating layer 4, a plurality of electrode film bridges 5, a first transmission structure 6, and voltage supply lines 01.

Specifically, referring to FIG. 3, the signal line 2 and the reference lines 3 are both disposed on the first substrate 1, and the reference lines 3 are located at least one side of an extending direction (e.g., a first direction S1) of the signal line 2, the signal line 2 and the reference lines 3 form a coplanar waveguide (CPW) transmission line. The first insulating layer 4 is disposed on a side of the signal line 2 distal to the first substrate 1 to insulate the signal line 2 from the electrode film bridges 5.

Further, the plurality of electrode film bridges 5 are provided on a side of the first insulating layer 4 distal to the signal line 2, each electrode film bridge 5 includes a main portion 51 and at least one connection portion 52. An orthographic projection of the main portion 51 on the first substrate 1 is at least partially overlapped with an orthographic projection of the signal line 2 on the first substrate 1; the at least one connection portion 52 is connected to the main portion 51, and an orthographic projection of a connection portion 52 on the first substrate 1 is at least partially overlapped with an orthographic projection of a reference line 3 on the first substrate 1. The connection portion 52 may support the main portion 51, so that the main portion 51 and the first insulating layer 4 on the signal line 2 have a certain gap therebetween, and a capacitor is formed between the main portion 51 and the signal line 2, so that a direct current bias voltage is applied to the main portion 51 and the signal line 2, and thus, the CPW transmission line becomes a variable capacitor periodic transmission line structure, thereby achieving the purpose of phase shifting. In order to adjust the amount of phase shift, a different number of electrode film bridges 5 may be connected together, forming a phase control unit. For example, in FIG. 1, first and second phase control units have one electrode film bridge 5, respectively, and third, fourth and fifth phase control units have 2, 4 and 8 electrode film bridges 5, respectively. Because different phase control units have different numbers of the electrode film bridges 5, the different numbers of the electrode film bridges 5 and the signal line 2 have different rightly opposite areas therebetween, so that capacitors with different sizes may be formed, and thus, the corresponding amount of phase shift are different. Therefore, a plurality of phase control units may be provided, one or more corresponding phase control units are driven according to the required amount of phase shift, and the amount of phase shift of the phase shifter may be adjusted. It should be noted that the phase shifter according to the embodiment of the present disclosure may be a Micro-Electro-Mechanical System (MEMS) phase shifter.

It should be noted that in the phase shifter provided in the embodiments of the present disclosure, only one reference line 3 may be disposed on the first substrate 1, and on any side of the extending direction of the signal line 2; two reference lines 3 may alternatively be provided on the first substrate, i.e. the reference lines 3 may include a first reference line 31 and a second reference line 32 provided on two opposite sides of the extending direction of the signal line 2, respectively. It will be described below in a case where the reference lines 3 include the first reference line 31 and the second reference line 32. If the phase shifter includes only one reference line 3, each electrode film bridge 5 includes only one connection portion 52, which is only provided on one side of the main portion 51; if the phase shifter includes the first reference line 31 and the second reference line 32, each electrode film bridge 5 includes two connection portions 52, i.e., a first connection portion 52a and a second connection portion 52b, one end of each of the first connection portion 52a and the second connection portion 52b is connected to both sides of the main portion 51, and the other end of each of the first connection portion 52a and the second connection portion 52b is fixed to the first reference line 31 and the second reference line 32, respectively, or fixed onto the first insulating layer 4 covering the first reference line 31 and the second reference line 32, respectively. It will be described below by taking an example where each electrode film bridge 5 includes the first connection portion 52a and the second connection portion 52b.

In the phase shifter provided in the embodiment of the present disclosure, the main portion 51 of each electrode film bridge 5 is bridged over the signal line 2 by the connection portions 52, and the direct current bias voltage is applied to the electrode film bridge 5 and the signal line 2. Specifically, the direct current bias voltage is applied to the connection portions 52 of the electrode film bridge 5 and then transmitted to the main portion 51 by the connection portions 52, so that an electrostatic attraction force may be generated between the main portion 51 and the signal line 2, thereby driving the main portion 51 to move toward a position close to the signal line 2 in a direction perpendicular to the signal line 2. That is, the main portion 51 may move. Specifically, when the direct current bias voltage is not applied between the main portion 51 and the signal line 2 by the connection portions 52 of the electrode film bridge 5, the main portion 51, and the gap, the first insulating layer 4, the signal line 2 form an on-state capacitor Con (that is, a capacitor when a signal passes through a switch) therebetween in the electrode film bridge 5. Like a capacitor between parallel plates, the on-state capacitor has a low capacitance value, on the order of if. The gap is a gap between the main portion 51 and the first insulating layer 4 covering the signal line 2. When the direct current bias voltage is applied between the main portion 51 and the signal line 2 by the connection portions 52 of the electrode film bridge 5, the main portion 51 changes a height of the gap under the electrostatic attraction force. When the applied direct current bias voltage is sufficiently great, the main portion 51 is pulled down by the electrostatic attraction to be in close contact with the first insulating layer 4, and the main portion 51, and the first insulating layer 4, the signal line 2 (i.e., a three-layer structure) form an off-state capacitance Coff with a larger capacitance value on the order of about pF therebetween in the electrode film bridge 5. The phase shift amount of each electrode film bridge 5 is determined by an overlapping area of the main portion 51 of the electrode film bridge 5 and the signal line 2 and a value of Con/Coff of the electrode film bridge 5.

It should be noted that the direct current bias voltage may be input to the electrode film bridge 5 by voltage supply lines 01. That is, the voltage supply lines 01 are disposed on the first insulating layer 4 distal to the first substrate, each electrode film bridge 5 is connected to one end of one voltage supply line 01, and the other end of the voltage supply line 01 is connected to a direct current bias voltage source (not shown in the figure).

Figure 4:
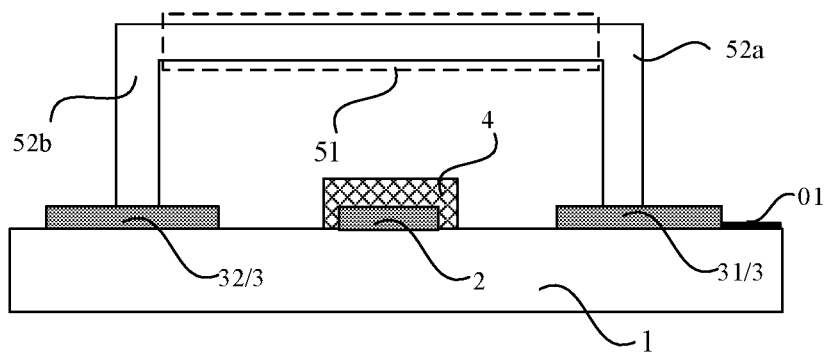
FIG. 4 is a cross-sectional view of a phase shifter (at an electrode film bridge) according to an embodiment of the present disclosure.

It should be noted that in the phase shifter provided in the embodiment of the present disclosure, the first insulating layer 4 may cover the signal line 2 and the reference lines 3 (as shown in FIG. 3), or may cover only the signal line 2 but not cover the first reference line 31 and the second reference line 32 (as shown in FIG. 4). Taking an example where the phase shifter includes the first reference line 31 and the second reference line 32, and the electrode film bridge 5 includes the first connection portion 52a and the second connection portion 52b, if the first insulating layer 4 covers the signal line 2 and the reference lines 3, the first connection portion 52a of the electrode film bridge 5 is connected between a side of the main portion 51 and the first insulating layer 4 covering the first reference line 31, and the second connection portion 52b is connected between the other side of the main portion 51 and the first insulating layer 4 covering the second reference line 32; if the first insulating layer 4 covers only the signal line 2, the first connection portion 52a of the electrode film bridge 5 is connected between a side of the main portion 51 and the first reference line 31, the second connection portion 52b is connected between the other side of the main portion 51 and the second reference line 32, and both the first reference line 31 and the second reference line 32 are connected to a reference voltage source, so that a potential of the electrode film bridge 2 is also a reference voltage supplied from the reference voltage source, and the direct current bias voltage may be input only to the signal line 2. It will be described below by taking an example where the first reference line 31 and the second reference line 32 are covered with the first insulating layer 4, and the first connection portion 52a and the second connection portion 52b are connected to the first insulating layer 4, which is not intended to limit the present disclosure.

It should be noted that, in the embodiment where the first insulating layer 4 covers the signal line 2 but does not cover the reference lines 3 (as shown in FIG. 4), since the first transmission structure 6 is used for inputting the direct current bias voltage to the signal line 2, the first transmission structure 6 may be disposed on the reference line 3 (the first reference line 31 or the second reference line 32) and extend to the signal line 2. That is, the first transmission structure 6 overlaps the reference line 3. Therefore, the overlapping region of the first transmission structure 6 and the reference line 3 is also covered with the first insulating layer 4 to insulate the first transmission structure 5 from the reference line 3.

As described above, in order to form a distributed capacitor between the electrode film bridge 5 and the signal line 2, it is necessary to input the direct current bias voltage to the signal line 2, and the signal line 2 also serves as a transmission line for radio frequency signals, so that the signal line 2 receives a low-frequency direct current bias voltage and a high-frequency radio frequency signal at the same time. In order to avoid the case where the insertion loss of the phase shifter is increased, and the stability is reduced which is caused by the leaking of the radio frequency signal to the transmission line for the direct current bias voltage, it is necessary to design an isolator for the direct current bias voltage and the radio frequency signal.

Figure 5:
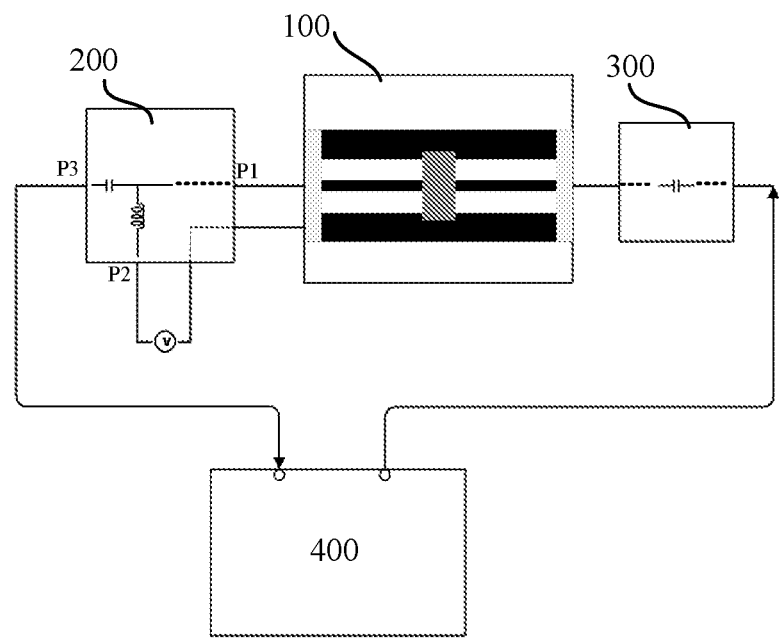
FIG. 5 is a schematic structural diagram of an exemplary phase shifter and an additional circuit.

Referring to FIG. 5, taking the phase shifter 100 of FIG. 1 as an example, a T-shaped bias device (Bias Tee) 200 may be connected to one end of the signal line 2, and an isolator (blocking device) 300 may be connected to the other end of the signal line 2, both of them are connected to an external device 400, such as a Vector Network Analyzer (VNA) capable of testing the performance of the phase shifter, which may provide a radio frequency signal (or test signal). The T-shaped bias device 200 has a first port P1, a second port P2 and a third port P3, wherein the first port P1 is connected to the signal line 2; the second port P2 is connected to one end of the direct current bias voltage source, and the other end of the direct current bias voltage source is supplied with the reference voltage, for example, the other end of the direct current bias voltage source may be connected to the reference lines 3 of the phase shifter; the third port P3 is connected to the external device 400. The external device 400 inputs a radio frequency signal to the signal line 2 via the isolator 300, wherein the isolator 300 has a capacitor and may isolate (block) the direct current bias voltage; the radio frequency signal is input into the first port P1 through the signal line 2, and is output from the third port P3 through the capacitor in the T-shaped bias device 200. Because the capacitor may isolate the direct current voltage and pass an alternating current signal, the radio frequency signal may be output from the third port P3, but the direct current bias voltage cannot pass through; the direct current bias voltage source inputs the direct current bias voltage through the second port P2, the direct current bias voltage passes through an inductor in the T-shaped bias device 200 and then is output to the signal line 2 from the first port P1, and the inductor may isolate alternating current signals and pass direct current signals, so that the direct current bias voltage may be output to the signal line 2 through the first port P1, and the radio frequency signal leakage may be avoided. The isolation of the direct current bias voltage and the radio frequency signal may be realized by the above circuit, which avoids the radio frequency signal leakage, but if the phase shifter is applied to a phased array antenna, including a plurality of phase shifters, it is difficult to provide the above circuit for each phase shifter.

Therefore, the phase shifter provided by the embodiment of the present disclosure further includes the first transmission structure 6, which is disposed on a side of the first insulating layer 4 distal to the first substrate 1, and is electrically connected to the signal line 2, and is configured to transmit the direct current bias voltage to the signal line 2 and block the radio frequency signal on the signal line 2. An orthographic projection of the first transmission structure 6 on the first substrate 1 is not overlapped with an orthographic projection of the plurality of electrode film bridges 5 on the first substrate 1.

In the phase shifter provided by the embodiment of the present disclosure, the first transmission structure 6 is provided, and may apply the direct current bias voltage to the signal line 2, which may avoid the leakage of the radio frequency signal on the signal line 2 to the first transmission structure 6, so that the low insertion loss performance of the phase shifter may be ensured, and the stability of the phase shifter is improved.

In the embodiment of the present disclosure, the first transmission structure 6 may include various kinds of specific structures, which are exemplified below.

In some examples, referring to FIGS. 1-2 and 6-7, in the phase shifter provided in the embodiments of the present disclosure, the first transmission structure 6 may be a high-resistance transmission line, a sheet resistance of which may be greater than that of the signal line 2; a first end of the high-resistance transmission line is connected to the signal line 2, and a second end of the high-resistance transmission line is connected to the direct current bias voltage source which is configured to provide the direct current bias voltage. Because the resistance of the high-resistance transmission line is large, as may be known from the circuit principle, for a steady-state circuit, almost no current exists, so that the direct current bias voltage is hardly influenced after passing through the high-resistance transmission line, and a high-frequency alternating current radio frequency signal hardly passes through the high-resistance transmission line. Therefore, the direct current bias voltage is input into the signal line 2 by using the high-resistance transmission line, the direct current bias voltage is not influenced, the stability of the phase shifter is improved, and the radio frequency signal on the signal line 2 may be effectively prevented from being output to the high-resistance transmission line, so that the radio frequency signal leakage may be prevented, and the low insertion loss performance of the phase shifter may be ensured.

In some examples, the material of the high-resistance transmission line may include various conductive materials with relatively high resistance, such as Indium Tin Oxide (ITO). Alternatively, the material of the high-resistance transmission line may include other conductive materials with relatively high resistance or a combination of multiple materials, which is not limited herein.

In some examples, the high-resistance transmission lines may be arranged in a straight line or a curved line, and may be arranged in various directions, which is not limited herein. In this embodiment, as shown in FIG. 1 and FIG. 2, it will be described below by taking an example where the high-resistance transmission line extends from an edge of the first substrate to the signal line 2 in a direction perpendicular to the extending direction of the signal line 2 (for example, S1), which is not limited in the present disclosure.

Figure 6:
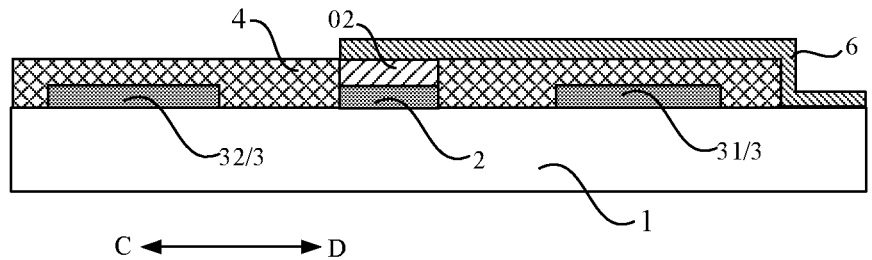
FIG. 6 is a cross-sectional view taken along a line C-D of FIG. 2.

Referring to FIGS. 2 and 6, the first insulating layer 4 may cover a side of the signal line 2, the first reference line 31, and the second reference line 32 distal to the first substrate 1. However, in order to enable the first transmission structure 6 to be connected to the signal line 2, the first insulating layer 4 may not be disposed on a first end 201 of the signal line 2. That is, the first insulating layer 4 has a hollow portion at a position corresponding to the first end 201 of the signal line 2, an orthographic projection of the first end 201 of the signal line 2 on the first substrate 1 is located in an orthographic projection of the hollow portion of the first insulating layer 4 on the first substrate 1, so as to expose the first end 201 of the signal line 2 through the hollow portion. The first transmission structure 6 is connected to the first end 201 of the signal line 2.

Figure 7:
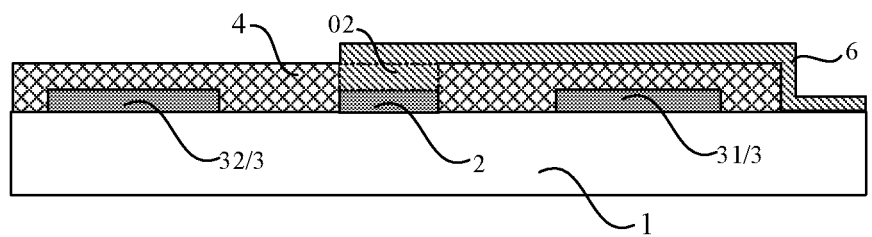
FIG. 7 is a cross-sectional view of a phase shifter (at a first transmission structure) according to an embodiment of the present disclosure.

Further, referring to FIGS. 6 and 7, since the first insulating layer 4 is not disposed on a first end 201 of the signal line 2, but is disposed on the other portions, there is a height difference between a surface of the first end 201 of the signal line 2 distal to the first substrate 1 and a surface of the first insulating layer 4 distal to the first substrate 1. A plane of the surface of the first end 201 distal to the first substrate 1 is lower than that of the surface of the first insulating layer 4 distal to the first substrate 1. If the first transmission structure 6 is directly provided, wire breakage and the like easily occur at a position with a large slope. Taking an example where the reference line 3 includes the first reference line 31 and the second reference line 32 respectively disposed at two sides of the extending direction (e.g. S1) of the signal line 2, when the surface of the first end 201 of the signal line 2 distal to the first substrate 1 and the surface of the first insulating layer 4 distal to the first substrate 1 are located in different planes, an auxiliary electrode 02 may be disposed on a side of the first end 201 of the signal line 2 distal to the first substrate 1 and in the hollow portion of the first insulating layer 4, a thickness of the auxiliary electrode 02 is substantially equal to the height difference between the surface of the first end 201 of the signal line 2 distal to the first substrate 1 and a surface of the first insulating layer 4 distal to the first substrate 1. That is, a surface of the auxiliary electrode 02 distal to the first substrate 1 and the surface of the first insulating layer 4 distal to the first substrate 1 are located at the same plane, so that the first end 201 of the signal line 2 may be flattened, a first end of the first transmission structure 6 may be connected to the first end 201 of the signal line 2 via the auxiliary electrode 6. Alternatively, referring to FIGS. 6 and 7, the material of the auxiliary electrode 02 may be different from that of the first transmission structure 6 (as shown in FIG. 6), or may be the same as that of the first transmission structure 6 (as shown in FIG. 7), which is not limited herein. Taking an example where the first transmission line 6 is the high-resistance transmission line, if the high-resistance transmission line is made of ITO, the auxiliary electrode 02 may be made of other metal materials. Alternatively, the auxiliary electrode 02 is also made of ITO, which is deposited in a different layer from ITO of the high-resistance transmission line, which is not limited herein. Each subsequent first transmission structure 6 may be connected to the signal line 2 by using the auxiliary electrode 02, which is not described in detail below.

In some examples, referring to FIGS. 8 to 11, in the phase shifter provided in the embodiments of the present disclosure, the first transmission structure 6 may be a high-frequency transmission line. Due to a parasitic effect, the high-frequency transmission line may generate a larger parasitic inductor, so that the first transmission structure 6 as the high-frequency transmission line is equivalent to being connected to a larger parasitic inductor L1, and an equivalent circuit diagram thereof is as shown in FIG. 12, where V represents the direct current bias voltage source connected to the high-frequency transmission line, CPWi is a radio frequency signal input end of the input signal line 2, CPWo is an connected device, such as VNA, etc., which is capable of providing a radio frequency signal. The direct current bias voltage may be input to the signal line 2 after passing through the parasitic inductor L1 formed by the high-frequency transmission line, the parasitic inductor L1 hardly affects the direct current bias voltage. If the radio frequency signal passes through the parasitic inductor L1, a self-induced electromotive force will be generated across the parasitic inductor L1, and have a direction opposite to a direction of the applied voltage, which blocks the radio frequency signal passing through (the parasitic inductor L1).

In this way, the high-frequency transmission line may effectively prevent the radio frequency signal on the signal line 2 from leaking to the high-frequency transmission line, so that the low insertion loss performance of the phase shifter may be ensured, and the stability of the phase shifter is improved.

Further, the high-frequency transmission line may be bent. Specifically, the high-frequency transmission line may include a plurality of first connection segments 6a and a plurality of second connection segments 6b, which are connected end to end to form a bending structure, the plurality of first connection segments 6a are arranged at intervals along the same direction, and each second connection segment 6b is connected between two adjacent first connection segments 6a. The plurality of first connection segments 6a extend along the first direction S1, the plurality of second connection segments 6b extend along the second direction S2, and the first direction S1 intersects with the second direction S2. Because the extending directions of the first connection segments 6a and the second connection segments 6b are different and are connected end to end, any two adjacent first connection segments 6a have a certain overlapping area in the arrangement direction of the first connection segments 6a, generating parasitic inductor therebetween, so that the bending structure formed by connecting the plurality of first connection segments 6a and the plurality of second connection segments 6b end to end forms a total parasitic inductor, which further increases the parasitic inductor L1 generated by the high-frequency transmission line. The high-frequency transmission line is bent, which may reduce its wiring area compared with a straight line.

In this embodiment, a capacitor C may be further connected to the signal line 2 as an isolator to isolate the direct current bias voltage. The capacitor C may be an external capacitor. Alternatively, an additional electrode may be further disposed above or below the signal line 2 to form a capacitor with the signal line 2 itself, which is not limited herein.

Figure 8:
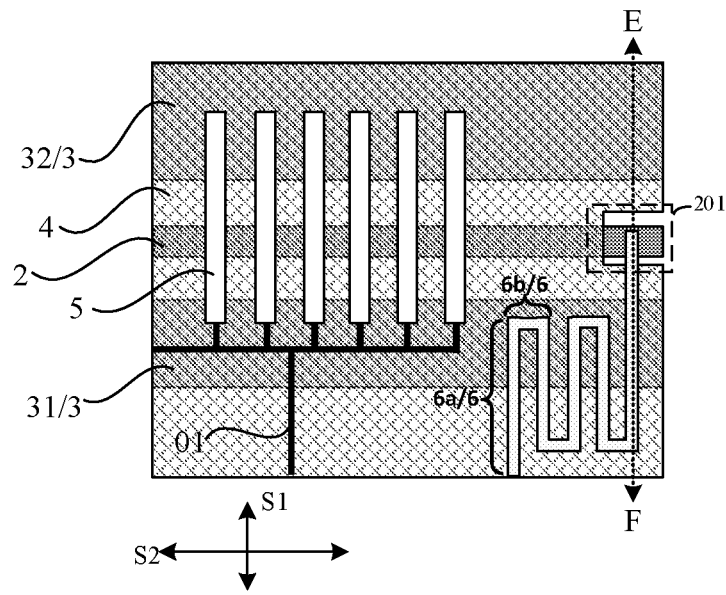
FIG. 8 is a schematic structural diagram of a phase shifter according to an embodiment of the present disclosure.
Figure 9:
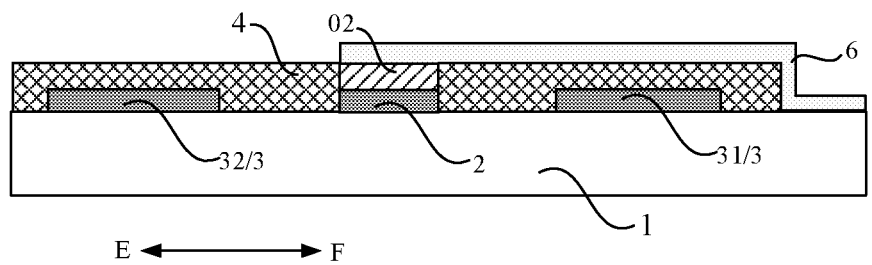
FIG. 9 is a cross-sectional view taken along a line E-F of FIG. 8.
Figure 10:
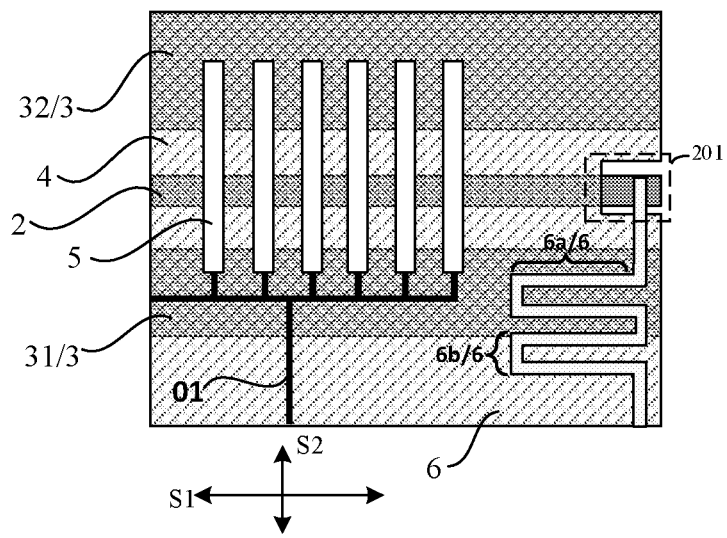
FIG. 10 is a schematic structural diagram of a phase shifter according to an embodiment of the present disclosure.

Optionally, referring to FIGS. 8, 9, 10, the high-frequency transmission line may have various arrangements, and a length of one first connection segment 6a may be different from that of one second connection segment 6a, as long as the first connection segment 6a and the second connection segment 6b may form the parasitic inductor. For example, referring to FIG. 8, the plurality of first connection segments 6a extend along the first direction S1, the plurality of second connection segments 6b extend along the second direction S2, and the first direction S1 intersects with the second direction S2, wherein the first direction S1 is perpendicular to the extending direction of the signal line 2, and the second direction S2 is parallel to the extending direction of the signal line 2, and the plurality of first connection segments 6a are arranged at intervals along the second direction S2 (a direction parallel to the extending direction of the signal line 2), the second connection segments 6b are respectively at both sides of the first connection segments 6a, each second connection segment 6b is connected between two adjacent first connection segments 6a, and the length of one first connection segment 6a is greater than the length of one second connection segment 6b.

Figure 11:
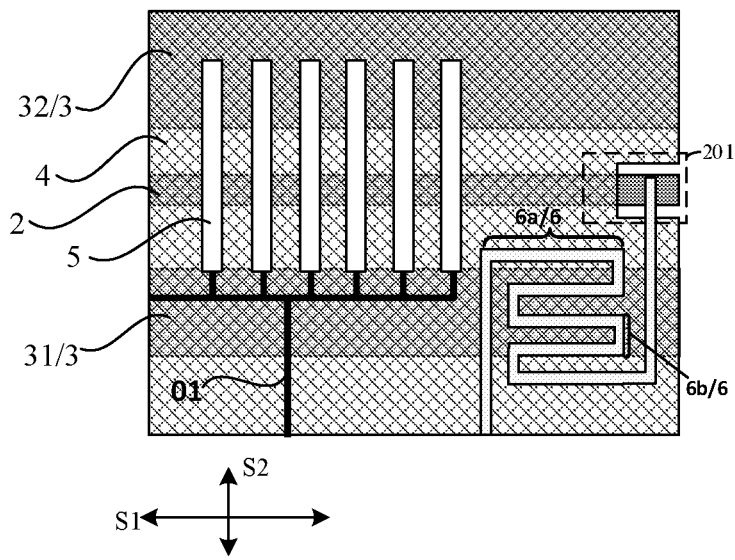
FIG. 11 is a schematic structural diagram of a phase shifter according to an embodiment of the present disclosure.
Figure 12:
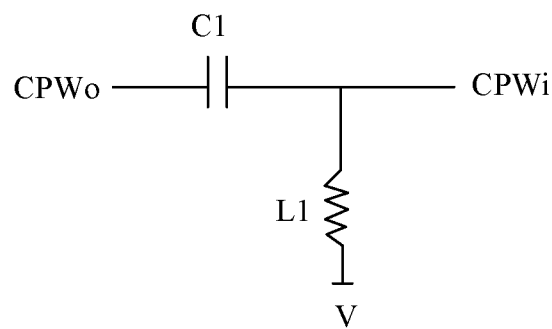
FIG. 12 is an exemplary equivalent circuit diagram of a phase shifter according to an embodiment of the present disclosure.

For another example, referring to FIGS. 10 and 11, the plurality of first connection segments 6a extend along the first direction S1, the plurality of second connection segments 6b extend along the second direction S2, and the first direction S1 intersects with the second direction S2, wherein the first direction S1 is parallel to the extending direction of the signal line 2, and the second direction S2 is perpendicular to the extending direction of the signal line 2, and the plurality of first connection segments 6a are arranged at intervals along the second direction S1 (a direction perpendicular to the extending direction of the signal line 2), the second connection segments 6b are respectively at both sides of the first connection segments 6a, each second connection segment 6b is connected between two adjacent first connection segments 6a, and the length of one first connection segment 6a is greater than the length of one second connection segment 6b. Referring to FIG. 10, in a direction in which the signal line 2 points to the first reference line 31, in the bending structure formed by the first connection segments 6a and the second connection segments 6b, the second connection segment 6b connected to the first connection segment 6a at the head end is connected to the signal line 2, and the second connection segment 6b connected to the first connection segment 6a at the tail end is connected to the external direct current bias voltage source. Referring to FIG. 11, in the direction in which the signal line 2 points to the first reference line 31, in the bending structure formed by the first connection segments 6a and the second connection segments 6b, the second connection segment 6b connected to the first connection segment 6a at the tail end is connected to the signal line 2, and the second connection segment 6b connected to the first connection segment 6a at the head end is connected to the external direct current bias voltage source. Alternatively, except for the high-frequency signal lines arranged in a zigzag manner, the high-frequency signal lines may be arranged in a variety of ways, such as, in an S-shaped arrangement, in a polyline arrangement, and the like, which is not limited herein.

Figure 13:
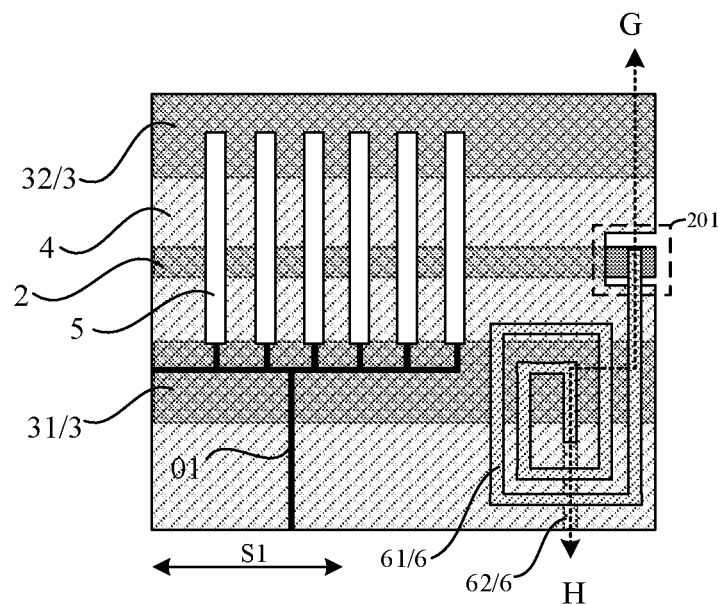
FIG. 13 is a schematic structural diagram of a phase shifter according to an embodiment of the present disclosure.
Figure 14:
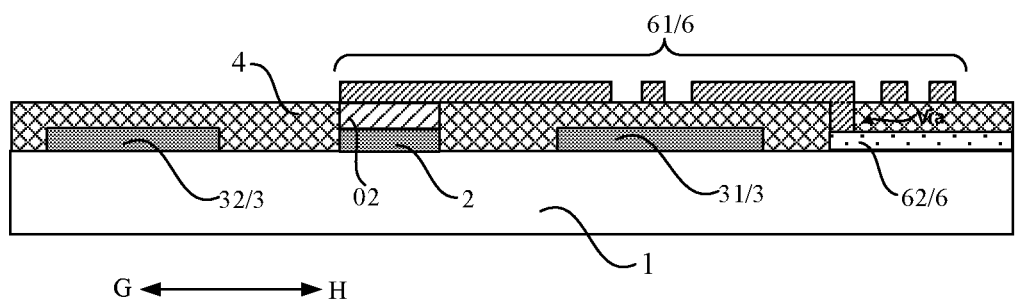
FIG. 14 is a cross-sectional view taken along a line G-H of FIG. 13.

In some examples, referring to FIGS. 13 and 14, in the phase shifter provided in the embodiments of the present disclosure, the first transmission structure 6 may include the first transmission line, which is arranged in a planar spiral shape to form a planar inductor. The first end of the first transmission line forming the planar inductor is connected to the signal line 2, and may be specifically connected to the first end 201 of the signal line 2, and the second end of the first transmission line is connected to the direct current bias voltage source, so as to transmit the direct current bias voltage to the signal line 2. Similarly, the direct current bias voltage may be input to the signal line 2 after passing through the planar inductor formed by first transmission line, the planar inductor hardly influences the direct current bias voltage, but if the radio frequency signal passes through the planar inductor, a self-induced electromotive force will be generated across the planar inductor, and have a direction opposite to a direction of the applied voltage, which blocks the radio frequency signal passing through (the planar inductor). In this way, the planar inductor may effectively prevent the radio frequency signal on the signal line 2 from leaking to the high-frequency transmission line, so that the low insertion loss performance of the phase shifter may be ensured, and the stability of the phase shifter is improved.

In some examples, one end of the planar inductor formed by the first transmission line is necessarily connected to the signal line 2, the other end necessarily extends to the edge of the first substrate 1 distal to the signal line 2 to be connected to the direct current bias voltage source, and one of two ends of the first transmission line arranged in the spiral shape is located at the middle of the spiral line, so that a cross-layer design is needed to be performed to enable the other end extending to the edge of the first substrate 1 distal to the signal line 2. Referring to FIGS. 13 and 14, in FIG. 13, in order to illustrate a positional relationship between a first sub-transmission line 61 and a second sub-transmission line 62, a filling pattern of the first sub-transmission line 61 is made semi-transparent, but the structure of the first sub-transmission line is not limited. The first transmission structure 6, which is the first transmission line, is divided into the first sub-transmission line 61 and the second sub-transmission line 62, the first sub-transmission line 61 is disposed on a side of the first insulating layer 4 distal to the first substrate 1, the second sub-transmission line 62 is disposed on a side of the first insulating layer 4 proximal to the first substrate 1. That is, the first sub-transmission line 61 and the second sub-transmission line 62 are disposed on opposite sides of the first insulating layer 4, and a through hole Via is disposed in the first insulating layer 4, and an orthographic projection of the through hole Via on the first substrate 1 is not overlapped with an orthographic projection of the reference line 3 (specifically, the first reference line 31 in the figure) on the first substrate 1. The first sub-transmission line 61 is arranged in the planar spiral shape to form the planar inductor, and is disposed on the first insulating layer 4, a first end of the first sub-transmission line 61 is connected to the first end 201 of the signal line 2, a second end of the first sub-transmission line 61 is connected to a first end of the second sub-transmission line 62 under the first insulating layer 4 through the through hole Via, and a second end of the second sub-transmission line 62 is connected to the direct current bias voltage source, so that the first sub-transmission line 61 and the second sub-transmission line 62 may be prevented from being short-circuited, and the planar inductor may be formed. The first sub-transmission line 61 and the second sub-transmission line 62 may be made of the same material or different materials, which is not limited herein.

It should be noted that the planar spiral shape of the arrangement of the first transmission line in this embodiment may include various types, for example, a rectangular spiral shape, a circular spiral shape, a hexagonal spiral shape, an octagonal spiral shape, and the like, and a line width, the number of turns, and the like of the planar inductor may be designed according to needs, which is not limited herein. In the present embodiment, the first transmission line are arranged in the rectangular planar spiral shape, which is taken as an example for explanation, but does not limit the present disclosure.

In some examples, an orthogonal projection of the first transmission structure 6 on the first substrate 1 at least partially overlaps an orthogonal projection of the reference line 3 on the first substrate 1, forming a parasitic inductor therebetween, and further preventing leakage of radio frequency signals. For example, referring to FIG. 8, in an embodiment in which the bending structure formed by the high-frequency transmission line is used as the first transmission structure 6, the first transmission structure 6 overlaps the first reference line 31, and except for the parasitic inductor formed between the first connection segment 6a and the second connection segment 6b, the first connection segment 6a and the second connection segment 6b may form parasitic inductors with the first reference line 31, respectively, so that an inductance value of the parasitic inductor is increased, and an effect of isolating radio frequency signals is better.

It should be noted that in the above example, the voltage transmission line 01 for inputting the direct current bias voltage to the electrode film bridge 5 may have various structures and various forms, and the voltage transmission line 01 may have the same material and shape as the first transmission structure 6 or may have a material and shape different from the first transmission structure 6, which is not limited herein.

In some examples, a thickness of the first insulating layer 4 between the first transmission structure 6 and the first substrate 1 may be increased, and/or a thickness of a material layer of the first transmission structure 6 may be reduced, which may further ensure the low insertion loss performance of the phase shifter.

In some examples, the entire structure of the first transmission structure 6 may be disposed on either side of the extending direction of the signal line 2, thereby reducing the wiring complexity.

In some examples, an edge of the connection portion 52 of each electrode film bridge 5 proximal to the signal line 2 is aligned with an edge of the reference line 3 corresponding to the connection portion 52 (i.e., the orthographic projections of the reference line 3 and the connection portion 52 on the first substrate 1 overlap with each other) proximal to the signal line 2, so that the electrode layers may be patterned by using the same mask pattern to form the electrode film bridges 5 and the reference line 3.

Optionally, in the phase shifter provided by the present embodiment, the electrode film bridge 5 may have various types of structures. For example, the main portion 51 may be a regular rectangle (as shown in FIG. 1). For another example, referring to FIG. 15, the main portion 51 of each electrode film bridge 5 is divided into two first portions 511 and a second portion 512 connected between the two first portions 511, and the connection portion 52 is connected to at least one of the two first portions 511. In the present embodiment, it will be described below in a case where the electrode film bridge 5 has two connection portions, and the first connection portion 52a is connected to one first portion 511, and the second connection portion 52b is connected to the other first portion 511. An orthographic projection of the first portion 511 of the main portion 51 on the first substrate 1 is not overlapped with the orthographic projection of the signal line 2 on the first substrate 1; an orthogonal projection of the second portion 512 of the main portion 51 on the first substrate 1 at least partially overlaps the orthogonal projection of the signal line 2 on the first substrate 1. In the extending direction of the signal line 2 (e.g., the first direction S1 in the figure), a width d1 of the connection portion 52 (including the first connection portion 52a and the second connection portion 52b) is not less than a width d2 of the first portion 511 of the main portion 51, and the width d2 of the first portion 511 of the main portion 51 is not less than a width d3 of the second portion 512 of the main portion 51, i.e., d1≥d2≥d3. In some examples, the first portion 511 may be trapezoidal, the width d2 of the first portion 511 gradually decreases in a direction from the second portion 512 pointing to the first portion 511, the short side of the first portion 511 is connected to the second portion 512, and the long side is connected to the connection portion 52. The second portion 512 may be rectangular, and a width where the second portion 512 is connected to the first portion 511 is substantially equal to a side length of the short side of the first portion 511. Therefore, since the second portion 512 is narrower and the second portion 512 forms a capacitor with the signal line 2 and moves downward under the electrostatic attraction, the narrower second portion 512 is more easily pulled, and a required direct current driving voltage is smaller; the connection portion 52 is used as a support for the main portion 51, and has a larger width, so that a stronger supporting force may be provided, and the mechanical stability of the electrode film bridge 5 is ensured; the first portion 511 then serves as a transition between the second portion 512 and the connection portion 52, and is connected therebetween. Alternatively, the electrode film bridge 5 may have other structures, which is not limited herein.

Figure 15:
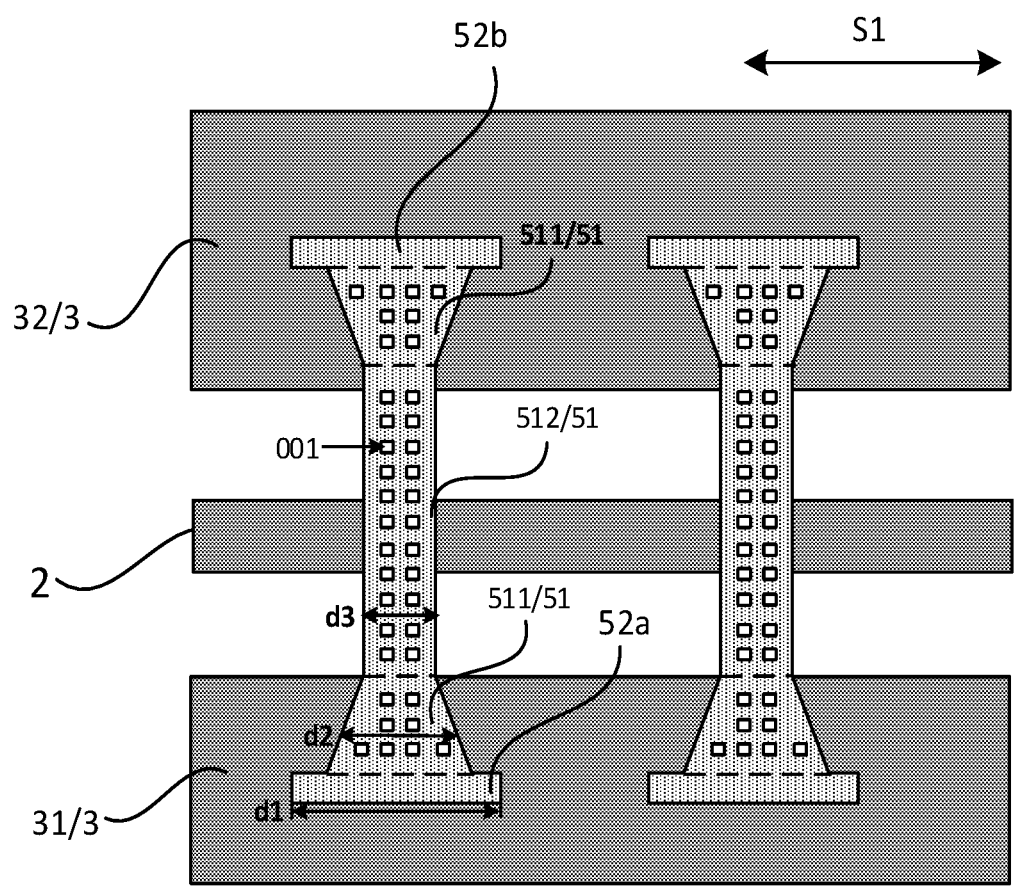
FIG. 15 is a schematic structural diagram of an electrode film bridge of a phase shifter according to an embodiment of the present disclosure.

In some examples, referring to FIG. 15, in the phase shifter provided by the embodiments of the present disclosure, a plurality of openings 001 may be distributed on at least partial region of the main portion 51 of each electrode film bridge 5, and the openings 001 may function to release stress, so that the electrode film bridge 5 is not easily collapsed and is more easily movable, and thus, the electrode film bridge 5 may be driven to be pulled down through a smaller direct current bias voltage. The openings 001 may have various shapes, such as a rectangle, a circle, etc., and the number and distribution positions of the openings 001 are not limited.

Figure 16:
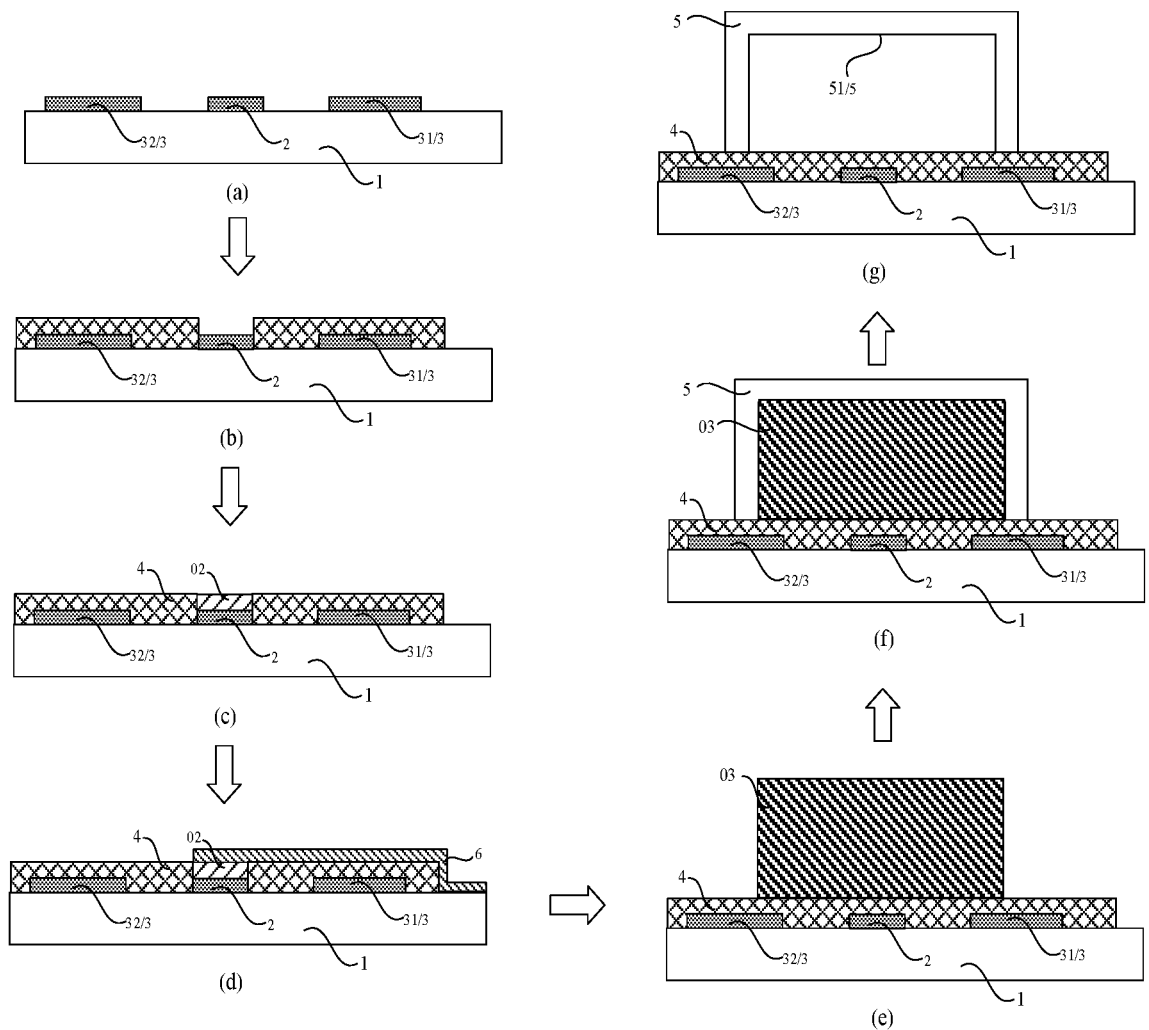
FIG. 16 is a flowchart of a method for manufacturing a phase shifter according to an embodiment of the present disclosure.

In a second aspect, referring to FIG. 16, an embodiment of the present disclosure further provides a method for manufacturing a phase shifter, which may include the following steps:

S1, forming a signal line 2 and reference lines 3 on a first substrate 1, the reference lines 3 being located on at least one side of an extending direction of the signal line 2.

Specifically, the first substrate 1 may be a glass substrate or a silicon-based substrate, and the first substrate 1 is prepared by cleaning, drying, and the like. Referring to FIG. 16(*a*), a first electrode layer may be formed on the first substrate 1 through a sputtering process, etc., and then, patterns of the signal line 2 and the reference lines 3 may be formed through an exposure, etching, development, etc.

S2, forming a first insulating layer 4 on the signal line 2 and the reference lines 3.

Specifically, referring to FIG. 16(*b*), the first insulating layer 4 is deposited on a side of the signal line 2 and the reference lines 3 distal to the first substrate 1, such that the first insulating layer 4 is coated outside the signal line 2 and the reference lines 3, the first insulating layer 4 is patterned, and a portion of the first insulating layer 4 covering the first end 201 of the signal line 2 is removed, so that the first end 201 of the signal line 2 is exposed.

S3, forming a first transmission structure 6 on the first insulating layer 4.

Specifically, referring to FIG. 16(*c*), since an upper surface of the signal line 2 and an upper surface of the first insulating layer 4 have a height difference therebetween, in order to facilitate connection, a material layer of the auxiliary electrode 02 may be deposited on a side of the first end 201 of the signal line 2 distal to the first substrate 1, and is patterned to form the auxiliary electrode 02.

Further, referring to FIG. 16(*d*), a material of the first transmission structure 6 is deposited on a side of the auxiliary electrode 02 and the first insulating layer 4 distal to the first substrate 1, and is patterned to be connected to the auxiliary electrode 02.

S4, forming a plurality of electrode film bridges 5 on the first insulating layer 4.

Specifically, referring to FIG. 16(*e*), a sacrificial layer 03 may be deposited on the first insulating layer 4, and an outer profile of the sacrificial layer 03 is attached to the inner side of the electrode film bridge 5. Referring to FIG. 16(*f*), a second metal layer is formed on the sacrifice layer 03, and then, is etched to form the electrode film bridge 5. Referring to FIG. 16(*g*), the phase shifter is flushed with a sacrificial layer release solution to release the sacrificial layer 03, thereby forming a complete phase shifter.

In a third aspect, the present disclosure further provides an antenna, which may include a plurality of phase shifters described above, and may further include a plurality of radiation units. Each phase shifter is connected to at least one radiation unit, which is used for transmitting the radio frequency signals phase-shifted by the phase shifter or receiving the radio frequency signals and then inputting the radio frequency signals to the phase shifter. The plurality of phase shifters may be arranged in an array and serve as a phased array antenna, and the first substrates 1 of the plurality of phase shifters may be integrally formed. The antenna may serve as a receiving antenna or a transmitting antenna. The phased array of the phase shifters is implemented by controlling the amount of phase shift of the plurality of phase shifters, so that the antenna may emit beams in different directions or receive beams in different directions, which is not limited herein.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A phase shifter, comprising:
   a first substrate;
   a signal line and reference lines on at least one side of an extending direction of the signal line, wherein the signal line and the reference lines are both on the first substrate;
   a first insulating layer on a side of the signal line distal to the first substrate;
   a plurality of electrode film bridges on a side of the first insulating layer distal to the signal line; each of the plurality of electrode film bridges comprises a main portion and at least one connection portion; an orthographic projection of the main portion on the first substrate at least partially overlaps with an orthographic projection of the signal line on the first substrate, and the main portion and the first insulating layer have a gap therebetween; the at least one connection portion is connected to the main portion, and an orthographic projection of the at least one connection portion on the first substrate at least partially overlaps with an orthographic projection of the reference lines on the first substrate; and
   a first transmission structure on a side of the first insulating layer distal to the first substrate and electrically connected to the signal line; and an orthographic projection of the first transmission structure on the first substrate is not overlapped with an orthographic projection of the plurality of electrode film bridges on the first substrate.

2. The phase shifter according to claim 1, wherein the first transmission structure is a high-resistance transmission line having a sheet resistance greater than that of the signal line, and a first end of the high-resistance transmission line is connected to the signal line and a second end of the high-resistance transmission line is connected to a direct current bias voltage source; and a material of the high-resistance transmission line at least comprises indium tin oxide.

3. The phase shifter according to claim 1, wherein the first transmission structure is a high-frequency transmission line comprising a plurality of first connection segments and a plurality of second connection segments which are connected end to end;
    the plurality of first connection segments are separated from each other along a same direction; each second connection segment is connected between two adjacent first connection segments; wherein,
    the plurality of first connection segments extend along a first direction, the plurality of second connection segments extend along a second direction, and the first direction intersects with the second direction.

4. The phase shifter according to claim 3, wherein one of the first direction and the second direction is perpendicular to the extending direction of the signal line, and the other is parallel to the extending direction of the signal line.

5. The phase shifter according to claim 3, wherein a length of one of the plurality of first connection segments is different from a length of one of the plurality of second connection segments.

6. The phase shifter according to claim 1, wherein the first transmission structure comprises a first transmission line, which is in a planar spiral shape, to form a planar inductor; and a first end of the first transmission line is connected to the signal line, and a second end of the first transmission line is connected to a direct current bias voltage source.

7. The phase shifter according to claim 6, wherein the first insulating layer has a through hole therein;
    the first transmission line comprises a first sub-transmission line and a second sub-transmission line; the first sub-transmission line is on a side of the first insulating layer distal to the first substrate, and the second sub-transmission line is on a side of the first insulating layer proximal to the first substrate; wherein,
    the first sub-transmission line is in the planar spiral shape to form the planar inductor, a first end of the first sub-transmission line is connected to the signal line, and a second end of the first sub-transmission line is connected to a first end of the second sub-transmission line through the through hole; and a second end of the second sub-transmission line is connected to the direct current bias voltage source.

8. The phase shifter according to claim 6, wherein the first transmission line is in a rectangular planar spiral shape.

9. The phase shifter according to claim 1, wherein a part of the first insulating layer is hollow to form a hollow portion, and an orthogonal projection of a first end of the signal line on the first substrate is within an orthogonal projection of the hollow portion on the first substrate; and
    an auxiliary electrode is on a side of the first end of the signal line distal to the first substrate, and a first end of the first transmission structure is connected to the first end of the signal line through the auxiliary electrode.

10. The phase shifter according to claim 1, wherein the orthographic projection of the first transmission structure on the first substrate at least partially overlaps the orthographic projection of the reference lines on the first substrate.

11. The phase shifter according to claim 1, wherein an edge of the connection portion proximal to the signal line is aligned with an edge of the reference line corresponding to the connection portion proximal to the signal line.

12. The phase shifter according to claim 1, wherein the main portion comprises two first portions and a second portion connected therebetween, and the connection portion is connected to at least one of the two first portions;
    an orthographic projection of the first portion on the first substrate is not overlapped with the orthographic projection of the signal line on the first substrate; an orthographic projection of the second portion on the first substrate at least partially overlaps with the orthographic projection of the signal line on the first substrate; wherein,
    along the extending direction of the signal line, a width of the connection portion is not less than a width of the first portion; the width of the first portion is not less than a width of the second portion.

13. The phase shifter according to claim 1, wherein the main portion has a plurality of openings therein.

14. A method for manufacturing a phase shifter, comprising steps of:
    forming a signal line and reference lines on a first substrate, the reference lines being located on at least one side of an extending direction of the signal line;
    forming a first insulating layer on a side of the signal line distal to the first substrate;
    forming a first transmission structure on a side of the first insulating layer distal to the first substrate, wherein the first transmission structure is electrically connected to the signal line; an orthographic projection of the first transmission structure on the first substrate is not overlapped with an orthographic projection of a plurality of electrode film bridges on the first substrate;
    forming the plurality of eletrode film bridges on a side of the first insulating layer distal to the signal line; wherein each electrode film bridge comprises a main portion and at least one connection portion; an orthographic projection of the main portion on the first substrate at least partially overlaps with the orthographic projection of the signal line on the first substrate, and a gap is formed between the main portion and the first insulating layer; the at least one connection portion is connected to the main portion, and an orthographic projection of the connection portion on the first substrate at least partially overlaps with the orthographic projection of the reference lines on the first substrate.

15. An antenna comprising a plurality of phase shifters, each of which is the phase shifter according to claim 1.

16. The antenna according to claim 15, wherein the first transmission structure is a high-resistance transmission line having a sheet resistance greater than that of the signal line, and a first end of the high-resistance transmission line is connected to the signal line and a second end of the high-resistance transmission line is connected to a direct current bias voltage source; and a material of the high-resistance transmission line at least comprises indium tin oxide.

17. The antenna according to claim 15, wherein the first transmission structure is a high-frequency transmission line comprising a plurality of first connection segments and a plurality of second connection segments which are connected end to end;
    the plurality of first connection segments are separated from each other along a same direction; each second connection segment is connected between two adjacent first connection segments; wherein,
    the plurality of first connection segments extend along a first direction, the plurality of second connection segments extend along a second direction, and the first direction intersects with the second direction.

18. The antenna according to claim 17, wherein one of the first direction and the second direction is perpendicular to the extending direction of the signal line, and the other is parallel to the extending direction of the signal line.

19. The antenna according to claim 17, wherein a length of one of the plurality of first connection segments is different from a length of one of the plurality of second connection segments.

20. The antenna according to claim 15, wherein the first transmission structure comprises a first transmission line, which is in a planar spiral shape, to form a planar inductor; and a first end of the first transmission line is connected to the signal line, and a second end of the first transmission line is connected to a direct current bias voltage source.

\* \* \* \* \*